United States Patent
Hideno et al.

[11] Patent Number: 5,900,761
[45] Date of Patent: May 4, 1999

[54] TIMING GENERATING CIRCUIT AND METHOD

[75] Inventors: Seiji Hideno, Gyoda; Noriyuki Masuda, Ageo; Masayuki Suzuki, Hanyu; Masatoshi Sato, Gyoda, all of Japan

[73] Assignee: Advantest Corporation, Tokyo, Japan

[21] Appl. No.: 08/716,434

[22] PCT Filed: Jan. 24, 1995

[86] PCT No.: PCT/JP95/00070

§ 371 Date: Sep. 20, 1996

§ 102(e) Date: Sep. 20, 1996

[51] Int. Cl.$^6$ .............................. H03K 5/13; H03K 5/159
[52] U.S. Cl. .................... 327/261; 327/231; 327/236; 327/237; 327/276; 327/105; 327/164
[58] Field of Search .................................... 327/261, 262, 327/141, 231, 237, 236, 244, 270, 276, 153, 149, 158, 164

[56] References Cited

U.S. PATENT DOCUMENTS 4,504,749   3/1985   Joshida .................................... 327/276

FOREIGN PATENT DOCUMENTS

| | | |
|---|---|---|
| 60-143017 | 7/1985 | Japan . |
| 1-115215 | 5/1989 | Japan . |
| 2-141123 | 5/1990 | Japan . |
| 2-295311 | 12/1990 | Japan . |
| 3-49417 | 3/1991 | Japan . |
| 5-220905 | 1/1993 | Japan . |

Primary Examiner—Timothy P. Callahan
Assistant Examiner—Dinh Le
Attorney, Agent, or Firm—Staas & Halsey

[57] ABSTRACT

A timing generating circuit formed as an LSI of CMOS-FETs is provided which enables correction of the variations of delay amount caused by the heat generated in the CMOS-FETs due to the propagation of pulses through the CMOS-FETs. A sub delay element 22 is connected in series to a main delay element 21 in which a timing is set and placed in the vicinity of the element 21. Both delay elements are connected in the same cell structure and arrangement. The sum of initial values of the delay amounts of respective delay elements is made to be a constant value. An input pulse to the main delay element is also supplied to a reference signal generator part 27 which outputs a reference signal using a reference clock after the lapse of the constant value from the time the input pulse is inputted. A time difference between this reference signal and the output from the sub delay element 22 is detected by a time difference detection part 29. Correcting amounts are calculated by splitting this time difference in accordance with the ratio of the initial values of the delay amounts. The delay amounts of the delay elements 21 and 22 are then corrected with the correcting amounts, respectively, such that the sum comes to the constant value.

10 Claims, 4 Drawing Sheets

TIMING GENERATING CIRCUIT AND METHOD

FIELD OF THE INVENTION

The present invention relates to a circuit for generating a timing signal and a method of generating a timing signal, which are applied, for example, to a semiconductor device testing apparatus and can generate a signal at a preset timing, and particularly, to such circuit and method which can generate a stable timing signal even in variation of temperature.

BACKGROUND OF THE RELATED ART

Electronic circuits each having a gate array formed by CMOS (complementary metal-oxide semiconductor) structure FETs (field effect transistors) tend to increase signal transmission delays as the temperature increases. It was thus necessary, when integrating a high precision timing generator formed by CMOS.FETs into an LSI, to incorporate therein a function that would always compensate for the variations in signal transmission delays resulting from the temperature variations. Especially, in the LSI formed by CMOS.FETs, the signal transmission delays not only may vary with the temperature variation in the LSI chip based on the ambient temperature changes but also based on the generation of heat in the LSI chip itself due to the transition between a high level and a low level of a signal that propagates through the CMOS.FETs. Therefore, the more frequently the edge transitions of a digital data occur that propagates through the CMOS.FETs, the higher the temperature in the LSI chip rises.

A timing generating circuit is arranged such that it receives a timing pulse consisting of a series of impulses or pulses inputted thereto, passes it through a delay element or elements the delay times of which are settable, and outputs a timing pulse with the set delay amount (phase). However, if the timing generating circuit is formed into a CMOS.LSI, the temperature of the CMOS cell itself (a basic gate unit formed by CMOS.FETs in the LSI) may vary between immediately before and after the timing generating circuit is activated. For example, when a timing pulse 11 is inputted to the CMOS cell at time $t_0$ as shown in FIG. 1A, the temperature thereof goes up step by step for each impulse of the input timing pulse 11 and then goes down very slowly, as shown in the curve 12 in FIG. 1B, and repeats such cycle, resulting in an overall increase in the cell temperature. With this temperature increase, the delay amount of the output timing pulse increases from the set value, as shown in the curve 13 in FIG. 1C, in a similar manner to the temperature increase curve 12, resulting in a degradation in the precision of timing. Therefore, in a timing generator for an application requiring a timing with high accuracy, it was required that various timing generating circuits of the timing generator have means for compensating for cell temperature variations independently provided, respectively.

When a timing pulse is received intermittently, i.e., in groups of impulses as shown in FIG. 1D, a deviation or lag of the output timing from the set value is increased for each group of pulses and is decreased between the groups of pulses as shown in FIG. 1E, which results in generation of so-called heat jitters.

To solve such a problem in a conventional high precision timing generator circuits, it was customary to always maintain the consumed electric power constant. That is, this problem was addressed by providing a dummy delay element of the same cell adjacent to a delay element such that the sum of the consumed electric power (generated heat amount) in both delay elements becomes a constant amount by causing the input timing pulse to pass through this dummy delay element when no timing pulse is outputted. This solution, however, could not remove most of the heat jitters caused by temperature variations that could occur faster than the heat propagation time delay from the dummy delay element, since the heat propagation time delay was caused due to distances between the adjacent cells. It was also difficult to perform stable temperature compensation due to potential changes in the heat generating conditions from the surrounding cells (control logic circuit) within the LSI.

Another conventional solution was to keep the entire cell temperature in the LSI constant. In this method, a ring oscillator as means for detecting temperature and a heater cell for temperature compensation are provided in the LSI, the cell temperature is detected in a high precision manner from the oscillation frequency of the ring oscillator, and the consumed electric power in the heater cell is controlled in accordance with the detected temperature to keep the entire cell temperature constant. This method, as in the previous method, does not directly detect the cell temperature of the delay element, and therefore generates heat propagation time delay from the ring oscillator to the delay element. Another problem of this method is that it tends to be affected with the noises generated by the ring oscillator and the heater cell.

Because the prior art system indirectly detects the temperature increase of the delay element to correct the delay amount as described above, it could not follow the dynamic changes of the delay amounts caused by the variations of the heat generated by timing pulses changing in real time.

It is therefore an object of the present invention to provide a high precision timing generating circuit and method that can correct the delay amounts by quickly following the dynamic changes of the delay amounts associated with the changes in the generated heat based on timing pulses that change in real-time.

SUMMARY OF THE INVENTION

The method of the present invention comprises the steps of connecting a sub delay element to the output side of a main delay element to establish timing; detecting, for each input pulse, a difference between a reference time and the time duration from a time that the input pulse is inputted to the main delay element to a time that the input pulse is outputted from the sub delay element; and adjusting, based on the ratio of the delay amount of the main delay element and the delay amount of the sub delay element, the delay amounts of the main delay element and the sub delay element such that the sum of both the delay amounts come to be equal to the reference time.

The reference time is set to N (N is an integer equal to or greater than one) times of the period $T_0$ of a reference clock, and re-timing of the input pulse is effected with the reference clock to supply the re-timed input pulse to the main delay element, and the lapse of the reference time is detected from the supply of said re-timed input pulse using the reference clock. Also, a plurality of taps one for each desired resolution are provided in the vicinity of the output end of the sub delay element, and when the lapse of the reference time is detected, the difference between the reference time and the time duration is obtained depending on from which tap among the plurality of taps the output pulse is outputted.

The timing pulse generating circuit according to the present invention comprises a main delay element receiving an input pulse and in which a timing is set; a sub delay element connected to the output end of the main delay element; a reference signal generator part receiving the input pulse and for outputting a reference signal after a reference time has elapsed; time difference detection means for detecting a time difference between the pulse outputted from the sub delay element and the reference signal; calculating means for calculating, based on the detected time difference, such correcting amounts of the main delay element and the sub delay element in accordance with the ratio of the delay amount of the main delay element and the delay amount of the sub delay element that the time difference comes to zero by these correcting amounts; and control means for effecting corrections of the delay amounts of the main delay element and the sub delay element by the calculated correcting amounts, respectively.

The reference time is set to be N (N is an integer equal to or greater than one) times of the period $T_0$ of a reference clock, and the timing generating circuit further includes re-timing means which effects re-timing of the input pulse with the reference clock to supply the re-timed input pulse to the main delay element, and the reference signal generator part is means for receiving the re-timed input pulse and the reference clock as inputs, and for generating the reference signal after the reference time has elapsed.

The time difference detection means is one which has a plurality of taps provided at the output end portion of the sub delay element such that the delay amount for each tap is sequentially shifted by the resolution of the time difference detection, and detects the time difference by detecting from which tap among the taps an output pulse is obtained in nearly coincident in time with the reference signal.

The reference signal generator part comprises a shift register of N stages for receiving the input pulse as an input, the input pulse being shifted by the reference clock. At least one shift stage is added to the front of the shift register, which functions as the re-timing means.

The main delay element comprises a main delay part and an infinitesimal delay part connected in series with each other, and the sub delay element also comprises a main delay part and an infinitesimal delay part connected in series with each other. Each of these infinitesimal delay parts is a variable delay part which can correct the variation of the delay amount based on the heat generated by one pulse in the basic cell, and is adapted to effect the delay corrections of the calculated correcting amounts to these infinitesimal delay parts. Also, in order to set the lower digit portions of the set delay amounts into the infinitesimal delay parts, the summed values of the respective lower digit portions and the correcting amounts are set into the infinitesimal delay parts, respectively.

DESCRIPTION OF THE PREFERRED EMBODIMENT

Figure 1:
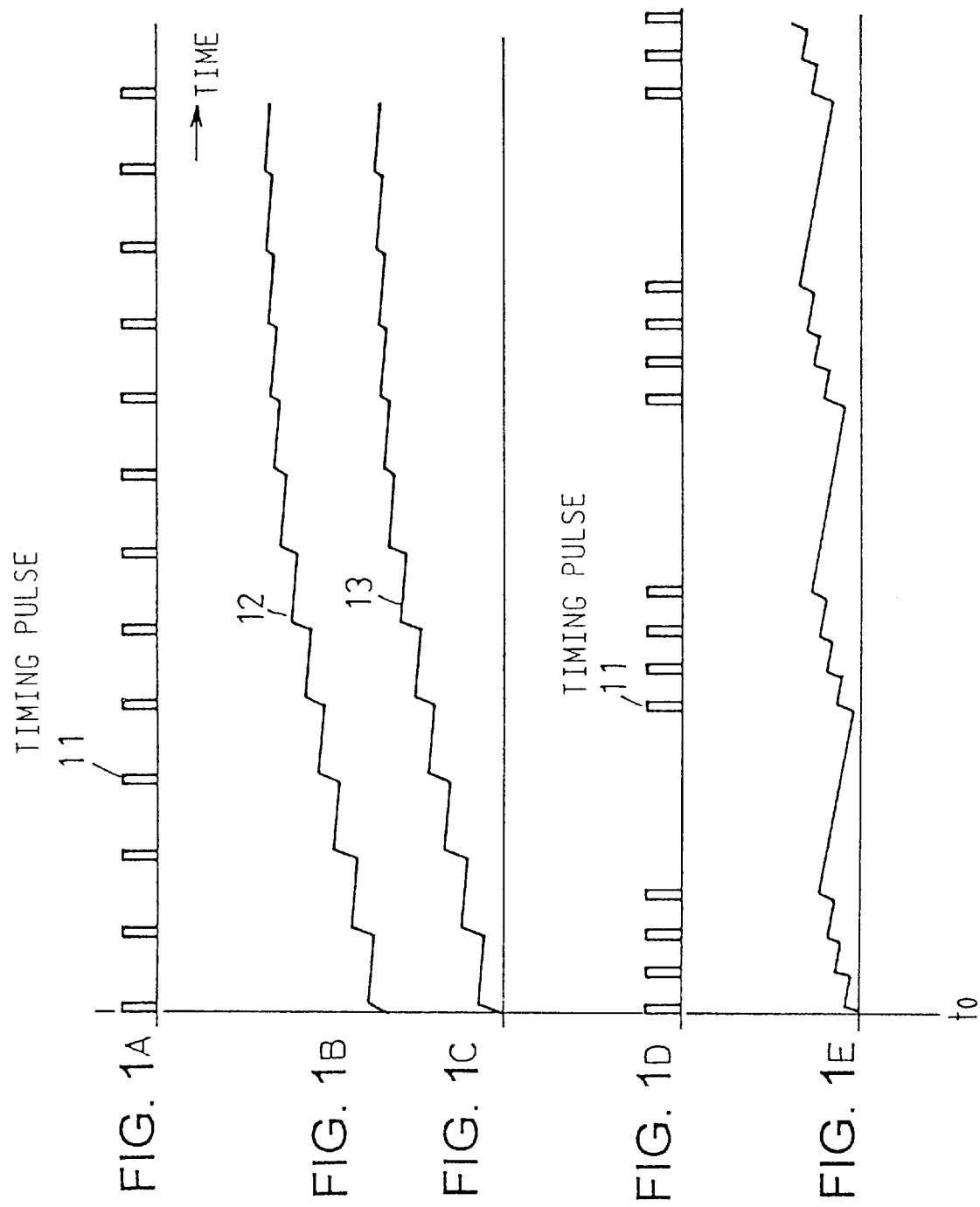
FIGS. 1A–1E are time charts showing the relationship between an input pulse, temperature increase of basic cells, and the deviation between the set value and an output timing.
Figure 2:
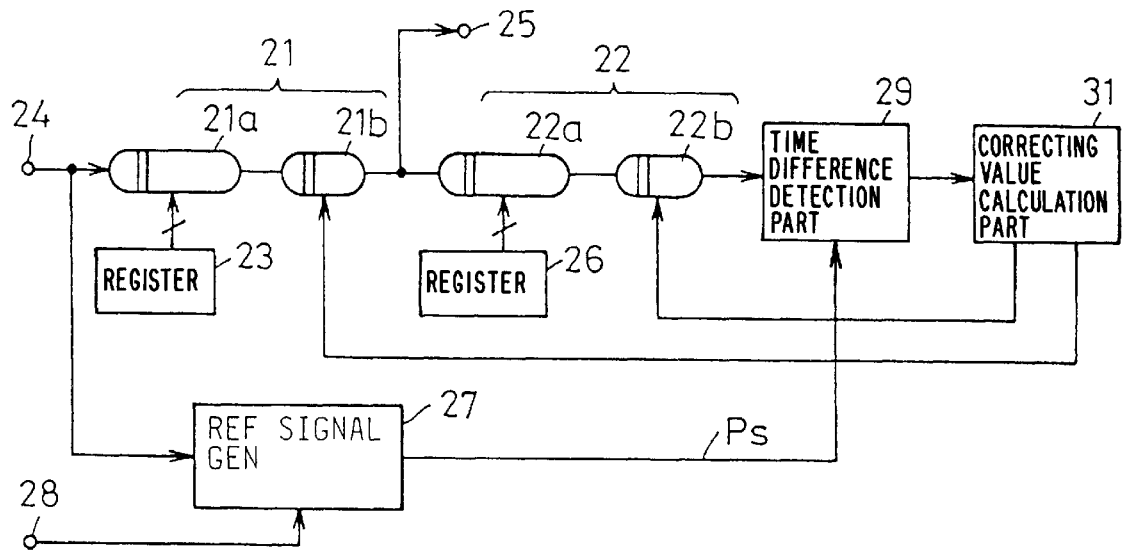
FIG. 2 is a block diagram briefly illustrating an embodiment of the present invention.

FIG. 2 shows an embodiment of the present invention. The main delay element 21 and the sub delay element 22 are connected in series with each other. The main delay element 21 provides a delay amount set for an input pulse, the register 23 is set with the desired delay amount, and the delay amount of the main delay element 21 is set in accordance with the set contents of the register 23. The input pulse is provided to the input terminal 24 of the main delay element 21 on the opposite side of the sub delay element 22, and an output timing pulse is obtained from the output terminal 25 led out of the end on the side of the sub delay element 22. In addition, a register 26 is provided to set the delay amount of the sub delay element 22. The delay elements 21 and 22 have the same cell structure and the same cell arrangement within the LSI with each other, and therefore have the same temperature vs. delay amount characteristic for temperature variations.

In this embodiment, the main delay element 21 comprises the main delay part 21a and the infinitesimal delay part 21b interconnected in series, and similarly, the sub delay element 22 comprises the main delay part 22a and the infinitesimal delay part 22b interconnected in series. The infinitesimal delay parts 21b and 22b both can compensate for the variations of the delay amounts caused by the heat generation in the basic cells by a single pulse, and thus can finely adjust the delay amount.

The input pulse from the input terminal 24 is also supplied to the reference signal generator part 27, which outputs the reference signal $P_s$ after the reference time $T_s$ is elapsed from the time the input pulse was supplied. Specifically, a reference clock is also supplied from the terminal 28 to the reference signal generator part 27. The period $T_0$ of the reference clock is selected to be one-Nth of the reference time $T_s$ (N is a positive integer). The reference signal $P_s$ is outputted after N times of the reference clocks from the time the input pulse was supplied. The time difference detection part 29 detects the time difference between the time when the input pulse is outputted from the sub delay element 22 after the input pulse was inputted to the terminal 24, and the reference signal $P_s$. The correcting value calculation part 31 then calculates, based on the detected time difference ΔT, the correcting amounts $\Delta_m$ and $\Delta_s$ for the main delay element 21 and the sub delay element 22, respectively, such that the sum of the delay amount of the main delay element 21 and the delay amount of the sub delay element 22 may become equal to the reference time $T_s=NT_0$. In this case, the ratio of the correcting amounts $\Delta_m$ to $\Delta_s$ is set to be equal to the ratio of the initial delay amount $D_m$ of the main delay element 21 to the initial delay amount $D_s$ of the sub delay element 22 ($D_m+D_s=T_0$). That is, $$\Delta_m = \Delta T \times \frac{D_m}{D_m + D_s}$$
$$\Delta_s = \Delta T \times \frac{D_s}{D_m + D_s}$$

and the correcting value calculation part 31 sets the delay amount to be set for the main delay element 21 to $D_m-\Delta_m$, and the delay amount to be set for the sub delay element 22 to $D_s-\Delta_s$. Since the settings of the corrections are applied to the infinitesimal delay parts 21b and 22b in this embodiment, if the initial delay amounts for the infinitesimal delay parts 21b and 22b are $D_{mf}$ and $D_{sf}$ respectively, then the set values to be applied to the infinitesimal delay parts 21b and 22b could be $D_{mf}-\Delta_m$ and $D_{sf}-\Delta_s$, respectively.

For example, assuming that the period $T_0$ of the reference clock to be 5 ns (200 MHz), the initial set value $D_m$ of the timing output to be 13 ns, the reference time $T_s$ to be $NT_0=20\times 5$ ns=100 ns, and the initial delay values of the main delay part 21a, the infinitesimal delma part 21b, the main delay part 22a, and the infinitesimal delay part 22b to be, respectively, $D_{mm}=10$ ns, $D_{mf}=3.0$ ns, $D_{sm}=85$ ns, and $D_{sf}=2.0$ ns. If an input pulse is inputted once to the input terminal 24 under this initial value state, and each delay amount of the delay elements 21 and 22 is increased by 1% due to the heat generated by the basic cells to, respectively, 10.1 ns, 3.03 ns, 85.85 ns, and 2.02 ns, then, the time difference increased by $\Delta T=1.00$ ns would be detected by the time difference detection part 29.

The correcting ratio for the main delay element 21 would then be 13 ns/100 ns=0.13 at this point, and thus the correcting amount $\Delta_m=1.00$ ns$\times 0.13=0.13$ ns would be obtained. Next, if this correcting amount is subtracted from the initial set value of the infinitesimal delay part 21b, i.e., $D_{mf}=3.0$ ns, the compensated set value of 2.87 ns would then be obtained. Additionally, since the delay amount itself of the infinitesimal delay part 21b has been increased by 1% due to the temperature increase, the actual delay amount of the infinitesimal delay part 21b would be 2.899 ns. As a result of this, the output pulse delay amount of the timing output terminal 25 would be 10.1 ns+2.899 ns=12.999 ns. It could be seen, as a result of this delay correction, that the next timing output would be 12.999 ns, which is a most correctly compensated timing output, against the uncorrected timing of 13.13 ns.

In the example illustrated above, the delay amounts are not compensated in a completely correct manner. This is because it was assumed that the detected time difference $\Delta T$ would vary as much as 1%. In actual situations, however, since the variation of the delay amount due to the heat generated in a unit cell by a single pulse is extremely small and is equal to or less than the detectable resolution, such error would not normally be generated.

Similarly, the correcting amount of the other infinitesimal delay part 22b would be $\Delta_s=0.87$ ns, and if this amount is subtracted from the initial set value (2.0 ns) of the infinitesimal delay part 22b, 1.13 ns would be obtained. The actual delay amount of the infinitesimal delay part 22b after correction would be 1.141 ns because of 1% increase due to the temperature increase of itself. As a result of this, the total delay amount of the main delay element 21 and the sub delay element 22 would be (10.1+2.899+85.85+1.141=) 99.99 ns.

Figure 3:
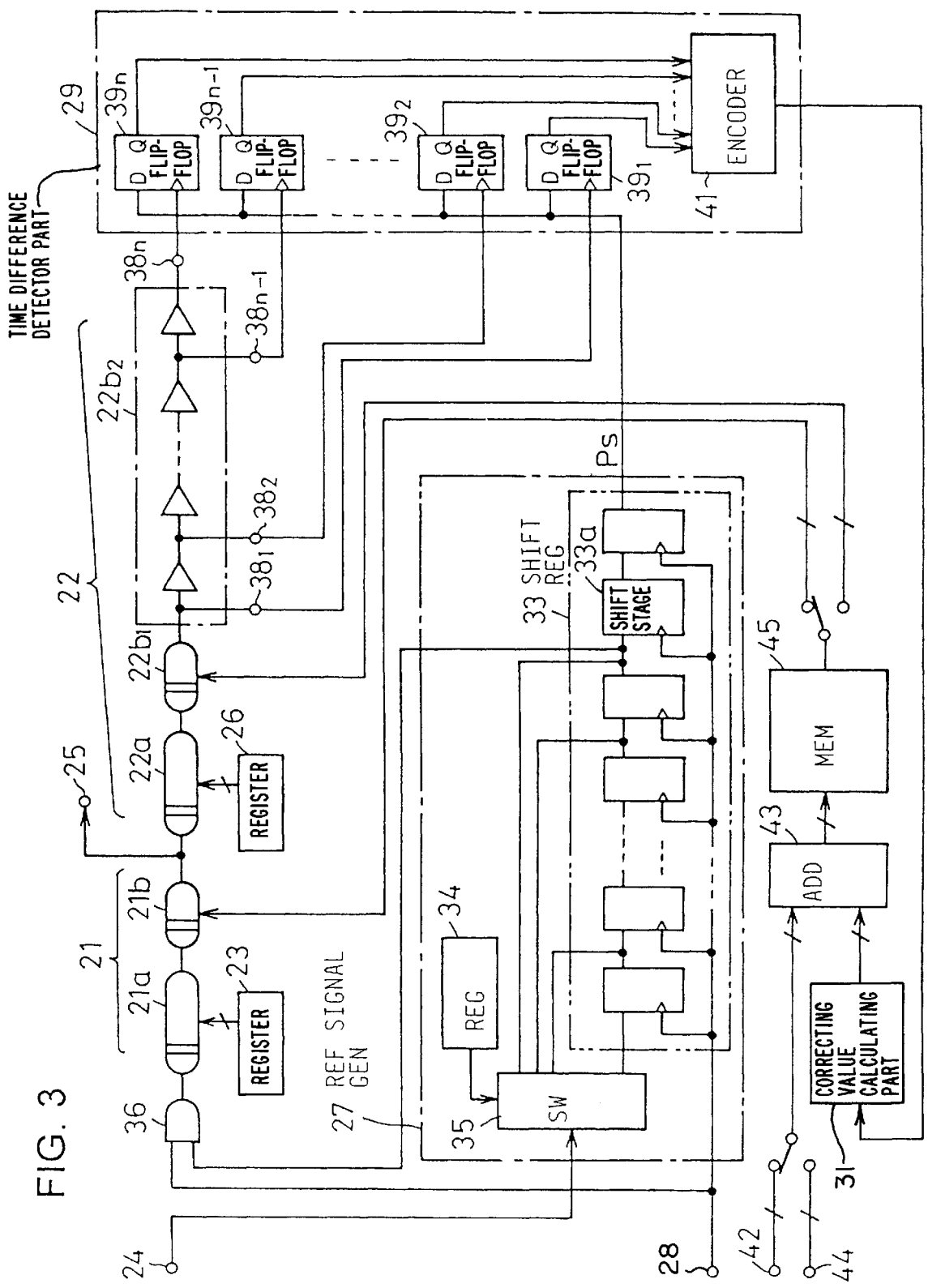
FIG. 3 is a block diagram illustrating an embodiment of the present invention.

FIG. 3 illustrates another embodiment according to the present invention. The same reference characters are applied to portions in FIG. 3 corresponding to those shown in FIG. 2. In this embodiment, the reference signal generator part 27 handles only the very small delay amount of the delay element 21 smaller than the period $T_0$ of the reference clock from the terminal 28 as well as performs re-timing of the input pulse from the input terminal 24 with the reference clock from the terminal 28. For this end, a shift register 33 to be operated by the reference clock from the terminal 28 is provided, the switching unit 35 is controlled by the register 34 in accordance with the value set in the register 34, the input pulse from the input terminal 24 is inputted into any appropriate stage of the shift register 33, the input of the stage 33a which is one stage before the last stage of the shift register 33 is branched out into the AND circuit 36, the reference clock from the terminal 28 is also inputted to the AND circuit 36, and the output of the AND circuit 36 is supplied to the delay element 21. The output of the shift register 33 is supplied to the time difference detection part 29 as a reference signal $P_s$. The integer value M is then obtained from the quotient of the delay amount to be supplied to the input pulse divided by the period $T_0$. If the integer value M is 1, then the input pulse is supplied to the stage which is one stage before the shift stage 33a, and if M is 2, the input pulse is supplied to the stage which is one stage further before the stage of the M=1 case. The integer value M is set in the register 34. Also in this example, the sum of both initial delay amounts $D_m$ and $D_s$ of the delay elements 21 and 22 would be $2\times T_0=10$ ns.

In this way, the input pulse is re-timed with the reference clock, and is delayed by the integer value M in the quotient of set delay amount divided by the period $T_0$ in the shift register 33 and then inputted into the delay element 21.

Also in this embodiment, a plurality of taps are provided at the output end portion of the delay element 22 so that the time difference detection part 29 can detect the position of a tap where it can get the pulse coincident with the reference signal $P_s$, thereby detecting the time difference between the output of the sub delay element 22 and the reference signal $P_s$. That is, a plurality of buffers 37 are connected in series at the output end portion of the sub delay element 22, and the taps $38_1-38_n$ are led out of appropriate connecting points of the buffers 37, respectively. The tap $38_n$ is the output end of the sub delay element 22. Each delay amount between the adjacent taps of the taps $38_1-38_n$ is determined based on the expected maximum value of the delay amount variations caused by the heat generated by a single pulse and the desired resolution of the timing to be set. There is no sense if each of the delay amounts is significantly smaller than the maximum value, nor can it be larger than the resolution. If the delay time of one element of the buffers (gates) 37 is equal to the delay amount equivalent to the detectable resolution of the time difference detection part 29, each of the taps $38_1-38_n$ is led out of each of the buffers 37. Also, prior to use, the position of a tap where the delay of the sum of the initial delay amounts $D_m$ and $D_s$ (10 ns in the example above) can be obtained would best be placed slightly before the last end $38_n$. The number of taps would be, for example, about 16, although this could vary depending on the resolution of timing.

Figure 4:
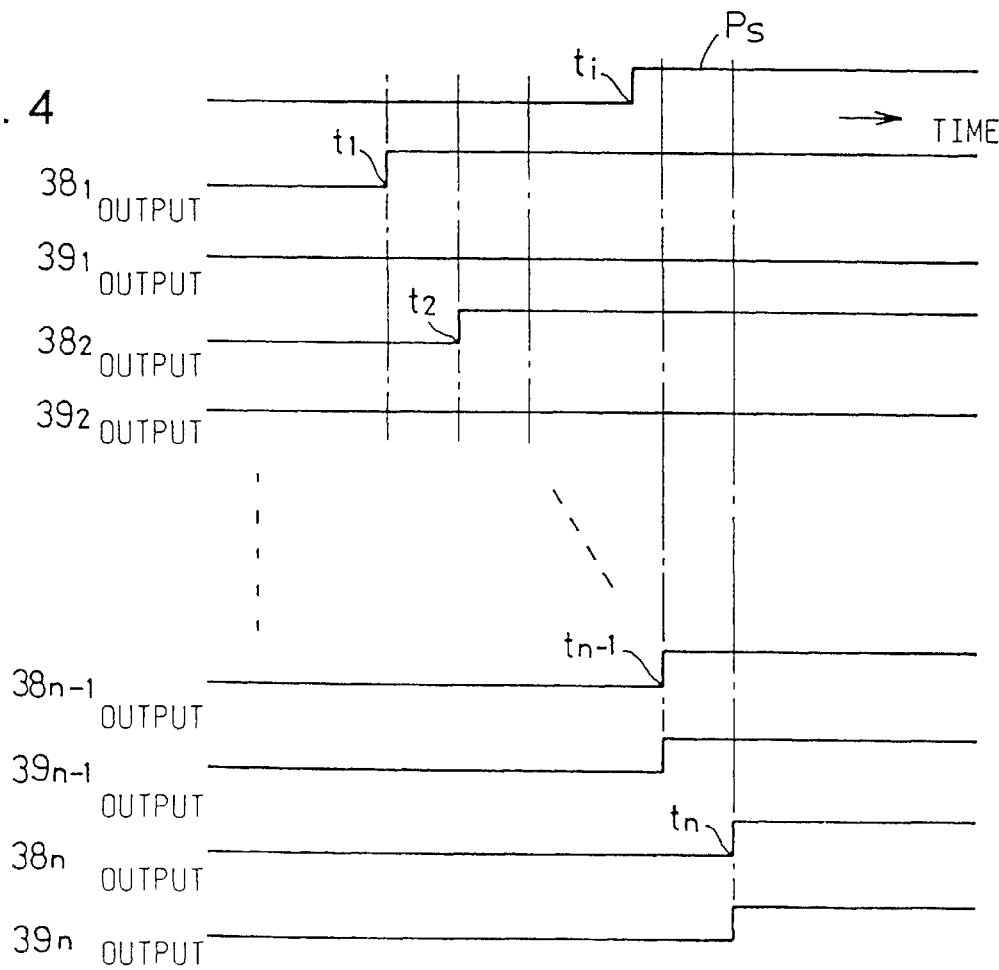
FIG. 4 is a time chart for explaining the operation of the time difference detection part 29 shown in FIG. 3.

The detection of whether any output pulse from these taps $38_1-38_n$ is coincident in time with the reference signal $P_s$ may, for example, be carried out in a manner described below. Flip-flops $39_1-39_n$ are provided within the time difference detection part 29. The reference signal $P_s$ is inputted to each data terminal D of the flip-flops $39_1-39_n$, and outputs from the taps $38_1-38_n$ are supplied to the trigger terminals, respectively. For example, as shown in FIG. 4, assuming that the reference signal $P_s$ is outputted and rises at time $t_i$, and that an output pulse from each of the taps $38_1-38_n$ is obtained at times $t_1-t_n$, respectively, then the flip-flops $39_1-39_n$ are triggered by the rising edges of the output pulses, respectively, and the state of the reference signal $P_s$ at that timing is kept. Therefore, although each of the outputs of the flip-flops $39_1$ and $39_2$ corresponding to the taps $38_1$ and $38_2$ where the outputs are obtained before $t_i$ remains at low level, each output of the flip-flops $39_{n-1}$ and $39_n$ corresponding to the taps $38_{n-1}$ and $38_n$ where the outputs are obtained after time $t_i$ rises to high level at times $t_{n-1}$ and $t_n$, respectively, and will remain in that state.

As the delay amounts of the delay elements 21 and 22 increase from this state, the flip-flop that may output high level will get closer to the $39_1$ side in accordance with the increase of the delay amount. Therefore, sequentially viewing the output states of the flip-flops $39_1$–$39_n$ from the $39_1$ side, the output of the tap $38_i$ which corresponds to the flip-flop $39_i$ turning to high level from low level at first will nearly be coincident with the reference signal $P_s$. Based on a deviation from the tap from which the output that was coincident with the reference signal $P_s$ in the initial state is obtained, the time difference between the reference signal $P_s$ and an output pulse from the delay element 22 may be detected. The encoder 41 then converts to digital values the time difference between the reference signal $P_s$ and the output pulse based on the output states of the flip-flops $39_1$–$39_n$, and then outputs the converted digital values to the correction calculation part 31. The correction calculation part 31, based on the time difference thus supplied, calculates the corrected delay amounts $D_m-\Delta_m$ and $D_s-\Delta_s$, as described previously with reference to FIG. 2.

In this embodiment, only the higher digit portion in the set delay amount for the delay element 21 is set in the register 23, and the lower digit portion $D_{mv}$ is supplied from the terminal 42 to the adder 43 to add this $D_{mv}$ to the compensated delay amount $D_m-\Delta_m$, and this summed value is set in the infinitesimal delay part 21b. Similarly, only the higher digit portion in the set delay amount for the delay element 22 is set in the register 26, and the lower digit portion $D_{sv}$ is supplied to the adder 43 to add this $D_{sv}$ to the compensated delay amount $D_s-\Delta_s$, and this summed value is set in the infinitesimal delay part 22b.

In this embodiment, the memory 45 is used, in setting the infinitesimal delay parts 21b and 22b, for compensating for the non-linear characteristic of the delay amount for the set value of the delay element and for absorbing/compensating for the manufacturing variances of $T_{pd}$ (propagation constant) for the LSI cell itself.

Figure 5:
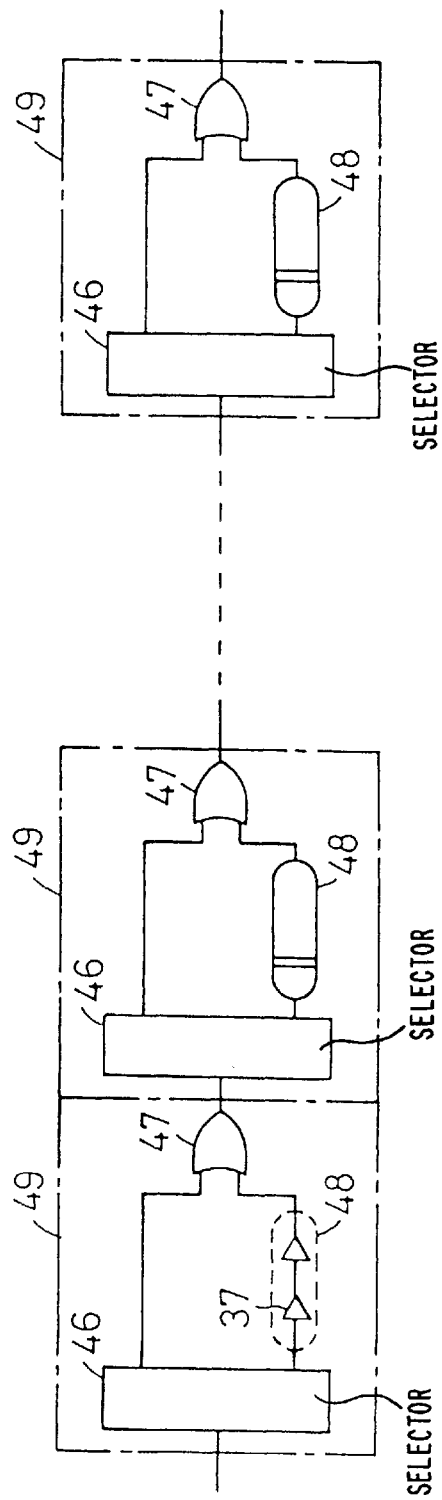
FIG. 5 shows an exemplary implementation of the variable infinitesimal delay part 21b; and, FIG. 6 is a block diagram illustrating another example of a portion where a plurality of taps are led out of the output end side portion of the sub delay element 22 shown in FIG. 3.

This will briefly be described below. FIG. 5 shows, for example, an exemplary structure for one digit of the delay amount for the delay part 21b. A plurality of units 49 are provided in series, wherein the selector 46 supplies an input pulse directly to the OR circuit 47, or indirectly to the OR circuit 47 via the delay element 48. The delay element 48 has one or more buffers (gates) 37 interconnected in series. If the delay amounts of the delay elements 48 of the four units 49 are selected to be, for example, 10 ps, 20 ps, 40 ps, and 80 ps, respectively, then the total delay amount of all four units 49 can be set to any of 0 ps, 10 ps, 20 ps, 30 ps, 40 ps, 50 ps, 60 ps, 70 ps, 80 ps, 90 ps, and 100 ps depending on the selection state of each of the four selectors 46. A relatively large number of units 49 are preferably used so that, in total, every desired delay amount could be obtained with as high precision as possible by absorbing the delay amount variances of the delay elements 48. The relationship of the select signal for the selector 46 in each of the units 49 versus each of the set delay amounts at this moment may be stored in the memory 45, and the select signal is read out of the memory 45 using the compensated delay amount as an address to control each of the selectors 46. The non-linearity of the delay characteristic may be similarly compensated. Such a conversion memory 45 may be created by obtaining the delay amount for each of the delay elements 48 by, for example, pre-calibration.

The select signals are read out from the memory 45 based on each output from the adder 43. The selectors 46 corresponding to the infinitesimal delay parts 21b and 22b are controlled by the select signals to set the lower digit portion of the set delay amount and the compensated delay amount in the infinitesimal delay parts 21b and 22b respectively for every input pulse. The calculation in the correcting value calculation part 31, the addition of each infinitesimal set value in the adder 43, and the conversion using the memory 45 relative to each summed value are normally performed in a controller part which includes a CPU.

Figure 6:
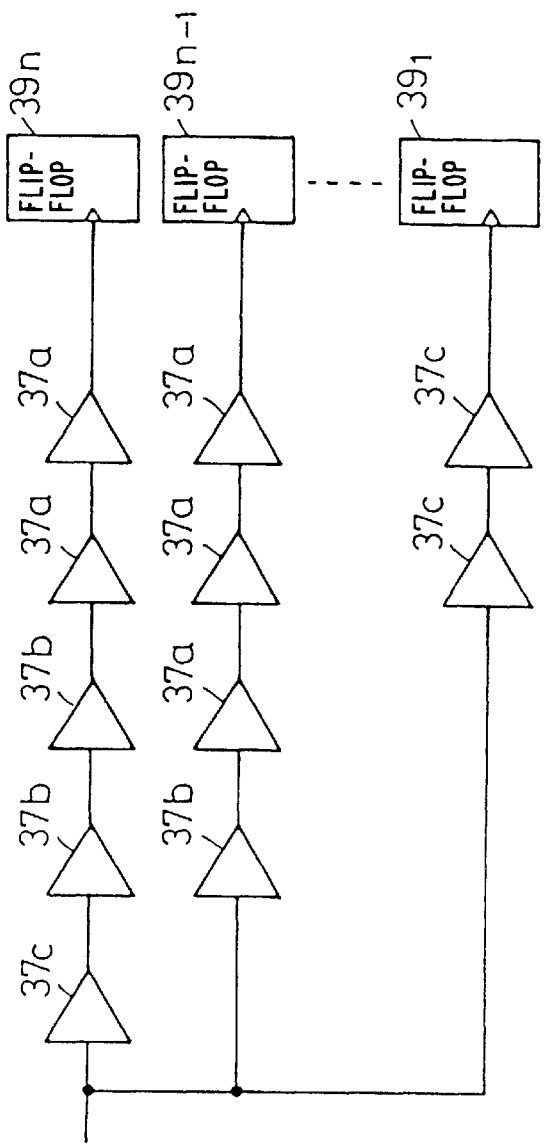

In FIG. 5, if the delay amount of the buffer 37 is smaller than the resolution of time difference detection, a tap is provided for each group of a plurality of the buffers 37, and the delay amount between adjacent taps may be adopted as the resolution of time difference detection. If the delay amount of the buffer 37 is larger than the resolution of time difference detection, each output of the combination of the serially connected buffers 37a, 37b, and 37c, as shown in FIG. 6, having the delay amount A, B, C (A>B>C, B+C>A), respectively, is provided to the respective trigger terminal of the flip-flops $39_1$–$39_n$, and the difference of the delay amount between the serial connections may be adopted as the resolution of time difference detection.

In the foregoing, each of the delay elements 21 and 22 could comprise of one delay element, rather than one main delay part and one infinitesimal delay part. In FIG. 3, even in case the delay amount of either one of the delay element 21 or 22 is assumed to be zero, since the pulses propagate through many gates each forming the selector 46 and the OR circuit 47 in the delay element as shown in FIG. 5, and thus the sum of the propagation time $T_{pd}$ of these gates may approximate to the reference clock period $T_0$=5 ns, the last two shift stages in the shift register 33 are used for generating the reference time. If the total delay time in the aforementioned case, i.e., where the delay amount of either one of the delay elements is zero, is significantly smaller than the period $T_0$, however, the number of shift stages required for generating the reference time could only be one, i.e., the last shift stage. The setting of the delay amounts for the delay elements 21 and 22 may also be performed as described with reference to FIG. 5, and also in this case, a conversion table similar to the memory 45 may be used.

According to the present invention, as described above, the main delay element 21 for setting a timing has the sub delay element 22 connected thereto, and the delay amount for each input pulse is corrected so that the total delay amount becomes the reference value. Consequently, the timing generating circuit and method of the present invention can follow and compensate in real-time for the variations of the delay amounts caused by the heat generated due to pulses. In addition, the variations of the timing output caused by the temperature variations in the LSI can be completely eliminated, and the generation of the heat jitters can be removed. In the embodiment shown in FIG. 3, the number of cells for making up the delay elements 21 and 22 can be significantly reduced. Although it is generally difficult to correct the timing with high precision for delay elements using a large number of cells because of variant temperature distributions depending on the layout of the cell components, a significantly smaller number of cells can make up the delay elements 21 and 22 according to the embodiment shown in FIG. 3 and significantly higher timing precision can thus be obtained. Also, in the embodiment of FIG. 3, the infinitesimal delay part may be used in common for setting the lower digit portion of the set delay amount and for setting the compensated delay amount. As a result, the structure is made simpler and the number of cell components is made fewer accordingly.

What is claimed is:

1. A timing pulse generating apparatus comprising:
    a main delay element responsive to an input pulse supplied thereto and generating a main delayed output signal as its output timing pulse with a main delay amount of pre-selected value, said main delay element comprising an output end;

a sub delay element connected to the output end of said main delay element and responsive to said main delayed output signal supplied thereto and generating a sub delayed output signal with a sub delay amount;

a reference signal generator responsive to said input pulse supplied thereto and outputting a reference signal when a reference time has elapsed;

time difference detection means for detecting a time difference between the sub delayed output signal outputted from said sub delay element and said reference signal;

calculating means for calculating, based on the detected time difference, a main correcting delay amount for said main delay element and a sub correcting delay amount for said sub delay element such that a ratio of said main correcting delay amount and a ratio of said sub correcting delay amount, respectively, to a sum of said main correcting delay amount and said sub correcting delay amount is set equal to a ratio of the main delay amount and a ratio of the sub delay amount, respectively, to a sum of the main delay amount and the sub delay amount and that said time difference comes to zero by these correcting delay amounts; and control means for effecting corrections of the delay amounts of said main delay element and said sub delay element by said calculated correcting delay amounts, respectively.

2. The timing pulse generating apparatus according to claim 1, further comprising:

re-timing means for re-timing of said input pulse with reference clock pulses so that the re-timed input pulse is supplied to said main delay element, wherein said reference time is set to be N (N is an integer equal to or greater than one) times of a period $T_0$ of said reference clock pulses; and said reference signal generator is means receiving said re-timed input pulse and said reference clock pulses as inputs, and for generating said reference signal when said reference time has elapsed.

3. The timing pulse generating apparatus according to claim 2, wherein said sub delay element includes at an output end thereof a buffer circuit which comprises a plurality of buffer elements connected in series to each other and has a plurality of taps at connection points of said buffer elements such that the delay amount for each said buffer element is set to be equal to a resolution of time difference detection by said time difference detection means, and said time difference detection means detects said time difference by detecting one tap among said taps from which an output pulse is obtained in nearly coincident in time with generating of said reference signal.

4. The timing pulse generating apparatus according to claim 3, wherein said reference signal generator comprises a shift register supplied with said reference clock pulses and said re-timed input pulse for shifting said input pulse in accordance with said reference clock pulses, and for outputting the thus shifted input signal as said reference signal.

5. The timing pulse generating apparatus according to claim 4, wherein a decimal fraction delay amount in a quotient of a division of said main delay amount to be given to said input pulse divided by the period $T_0$ of the reference clock pulses is set in said main delay element;

said shift register includes, at a front part thereof, a plurality of shift stages, a number of which is equal to an integer value of the quotient;

said input pulse is supplied to a first stage of the shift stages;

an output signal derived from an output end of a last one of the shift stages is utilized on one hand in the shift register to output said reference signal and is branched out on the other hand to said main delay element; and said shift stages also functions as said re-timing means.

6. The timing pulse generating apparatus according to claim 1, wherein each of said main delay element and said sub delay element comprises a main delay part and an infinitesimal delay part interconnected in series to each other, respectively;

said respective main delay parts of said main and sub delay elements are for setting the main or sub delay amount, respectively; and said respective infinitesimal delay parts are for setting the main or sub correcting delay amount, respectively.

7. The timing pulse generating apparatus according to claim 6, further comprising adding means, wherein each of said main delay parts of said main delay element and said sub delay element is set with higher digit portion of the main delay amount or the sub delay amount, respectively; and said adding means operatingly adds lower digit portion of each of said delay amounts to each of said main and sub collecting delay amounts, respectively, and sets each of summed results in the respective main or sub infinitesimal delay part, respectively.

8. The timing pulse generating apparatus according to claim 7, further comprising a memory storing a conversion table to convert each of said summed results from said adding means to a control signal for the respective infinitesimal delay parts, respectively.

9. A method of generating a timing pulse having a desired delay amount comprising the steps of:

connecting a sub delay element to an output side of a main delay element, said sub delay element and said main delay element being set to provide a sub delay amount and said desired delay amount to an input pulse supplied thereto, respectively;

detecting, for each input pulse, a time difference between a reference time period and a time duration from a time when said input pulse is inputted to said main delay element to a time when said input pulse is outputted from said sub delay element; and correcting, based on the ratio of the desired delay amount of said main delay element to the sub delay amount of said sub delay element, the delay amounts of said main delay element and said sub delay element such that a sum of both the delay amounts comes to be equal to said reference time period.

10. The method according to claim 9, further comprising the steps of:

setting said reference time period to N (N is an integer equal to or greater than one) times of a period $T_0$ of reference clock pulse;

re-timing said input pulse with said reference clock pulses so as to supply said input pulse thus processed by re-timing to said main delay element;

detecting a lapse of time as said reference time period from supply of said re-timed input pulse using said reference clock pulses;

providing a plurality of taps at each connected point of series connected buffer gate elements which are connected to an output end of said sub delay element, each of said buffer elements having a delay amount which is set to be equal to a resolution of time difference detection by said step of detecting the time difference; and obtaining, when said lapse of time as the reference time period is detected, said difference between said reference time period and the time duration depending on from which tap among said plurality of taps the output pulse is outputted.

* * * * *